United States Patent
Shaeffer et al.

(10) Patent No.: US 10,445,226 B2
(45) Date of Patent: Oct. 15, 2019

(54) VERIFY BEFORE PROGRAM RESUME FOR MEMORY DEVICES

(75) Inventors: Ian Shaeffer, Los Gatos, CA (US); Brent S. Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 420 days.

(21) Appl. No.: 13/814,917

(22) PCT Filed: Aug. 4, 2011

(86) PCT No.: PCT/US2011/046664
§ 371 (c)(1),
(2), (4) Date: Feb. 7, 2013

(87) PCT Pub. No.: WO2012/021379
PCT Pub. Date: Feb. 16, 2012

(65) Prior Publication Data
US 2013/0138882 A1    May 30, 2013

Related U.S. Application Data

(60) Provisional application No. 61/372,353, filed on Aug. 10, 2010.

(51) Int. Cl.
*G06F 12/00* (2006.01)
*G11C 16/00* (2006.01)
*G11C 16/08* (2006.01)
*G11C 16/10* (2006.01)
*G11C 16/34* (2006.01)

(52) U.S. Cl.
CPC ............. *G06F 12/00* (2013.01); *G11C 16/08* (2013.01); *G11C 16/10* (2013.01); *G11C 16/344* (2013.01)

(58) Field of Classification Search
None
See application file for complete search history.

(56) References Cited

U.S. PATENT DOCUMENTS 5,802,343 A    9/1998   Fandrich et al.
6,137,729 A    10/2000  Choi
(Continued)

OTHER PUBLICATIONS

Voltage-Driven Multilevel Programming in Phase Change Memories, A. Cabrini, S. Braga, A. Manetto, and G. Torelli, 2009, IEEE.*
(Continued)

*Primary Examiner* — Reginald G Bragdon
*Assistant Examiner* — Michael L Westbrook
(74) *Attorney, Agent, or Firm* — Lance Kreisman; Peninsula Patent Group

(57) ABSTRACT

A method of programming data into a memory device including an array of memory cells is disclosed. The method comprises receiving at least one program command that addresses a number of the memory cells for a programming operation to program data in the memory cells. The at least one program command is executed by iteratively carrying out at least one program/verify cycle to incrementally program the addressed memory cells with the program data. A secondary command may be selectively received after initiating but before completing the programming operation. The programming operation may be selectively resumed by first verifying the memory cells, then carrying out at least one program/verify cycle.

16 Claims, 11 Drawing Sheets

(56) References Cited

U.S. PATENT DOCUMENTS

| | | | |
|---|---|---|---|
| 6,836,432 B1 * | 12/2004 | Parker et al. | 365/185.03 |
| 6,930,925 B2 * | 8/2005 | Guo et al. | 365/185.28 |
| 7,349,245 B2 * | 3/2008 | Kim et al. | 365/158 |
| 7,404,033 B2 | 7/2008 | Li et al. | |
| 7,660,163 B2 * | 2/2010 | Ahn | 365/185.22 |
| 7,701,757 B2 * | 4/2010 | Kim et al. | 365/158 |
| 8,332,577 B2 * | 12/2012 | Traister et al. | 711/103 |
| 2003/0210585 A1 | 11/2003 | Bernardi et al. | |
| 2005/0248993 A1 | 11/2005 | Lee et al. | |
| 2006/0221704 A1 | 10/2006 | Li et al. | |
| 2009/0172257 A1 * | 7/2009 | Prins et al. | 711/103 |
| 2009/0265508 A1 | 10/2009 | Bennett et al. | |
| 2009/0310408 A1 | 12/2009 | Lee et al. | |
| 2010/0322005 A1 * | 12/2010 | Dong et al. | 365/185.17 |
| 2011/0055453 A1 * | 3/2011 | Bennett | G11C 16/10 711/103 |

OTHER PUBLICATIONS

International Preliminary Report on Patentability (Chapter I) dated Feb. 21, 2013 in International Application No. PCT/US2011/046664. 6 pages.

* cited by examiner

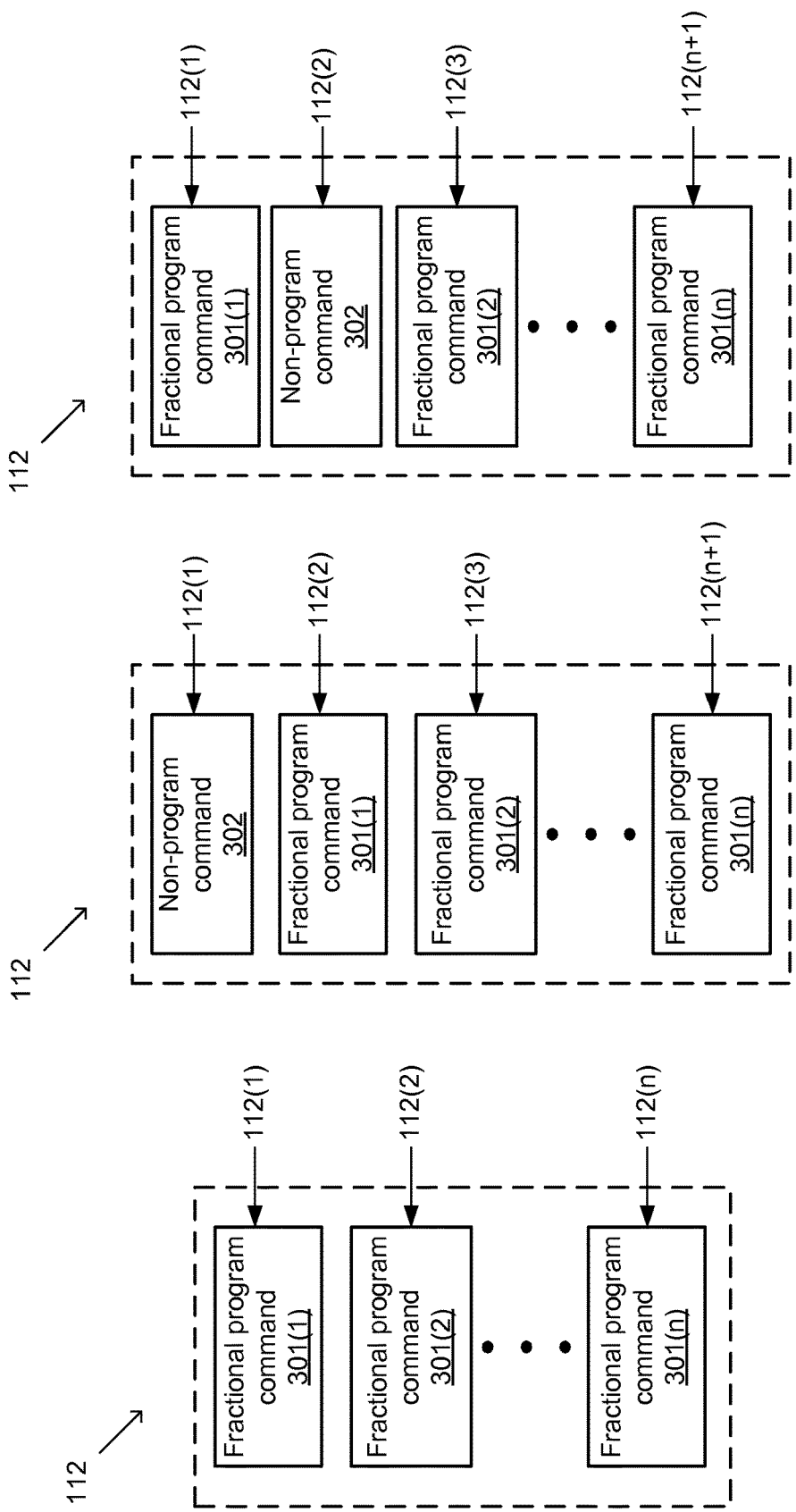

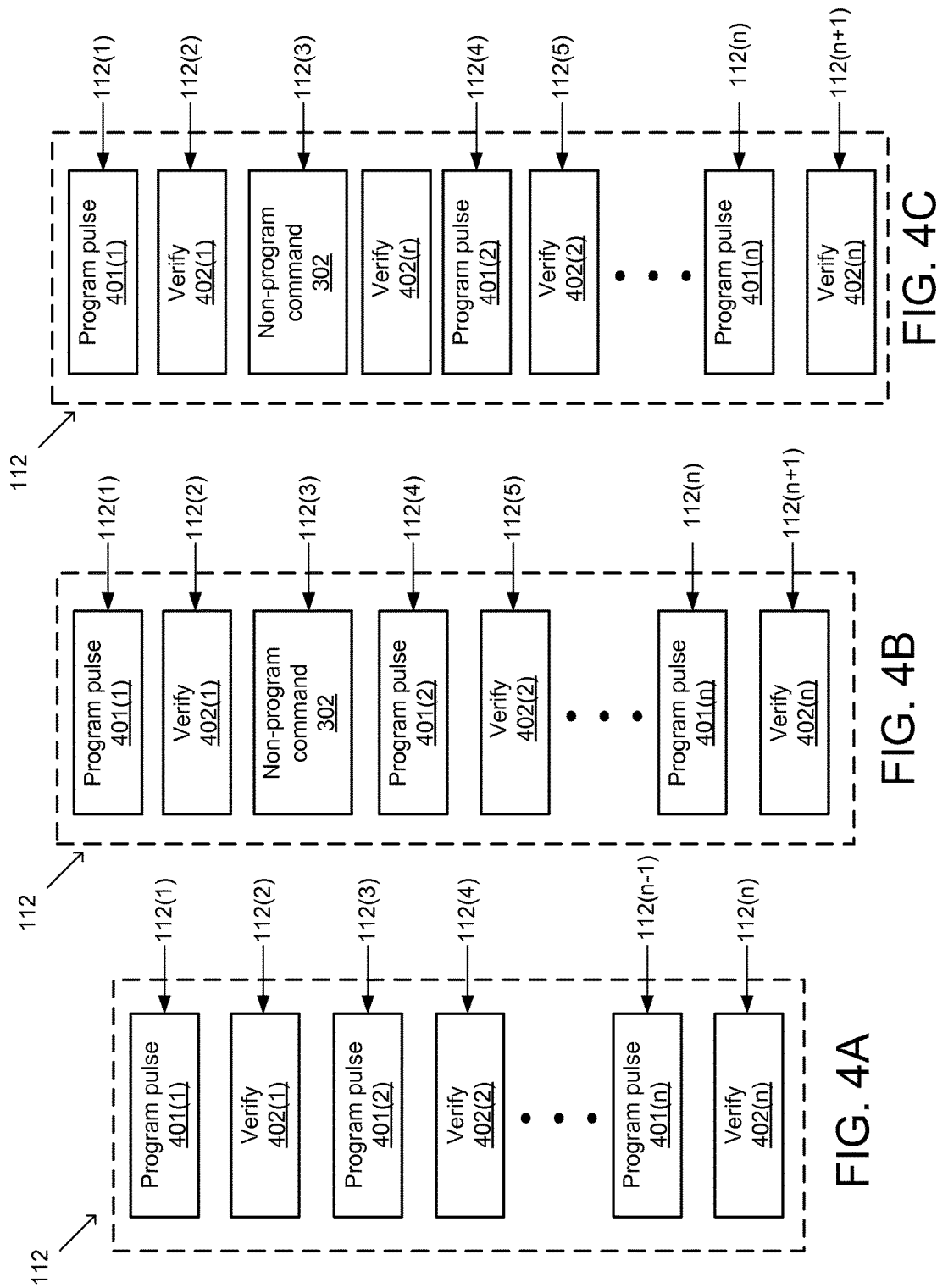

VERIFY BEFORE PROGRAM RESUME FOR MEMORY DEVICES

CROSS-REFERENCE TO RELATED APPLICATIONS/TECHNICAL FIELD

Pursuant to 35 U.S.C. § 365, this application claims priority from International Application No. PCT/US2011/046664, published as WO 2012/021379 A2 on Feb. 16, 2012, which claims priority from U.S. Provisional Application No. 61/372,353, filed Aug. 10, 2010 and entitled "VERIFY BEFORE PROGRAM RESUME FOR MEMORY DEVICES". International Application No. PCT/US2011/046664 and U.S. Provisional Application No. 61/372,353 are hereby incorporated by reference in their entirety.

This disclosure relates generally to memory devices, and more specifically, to programming operations for memory devices that utilize incremental programming techniques.

TECHNICAL FIELD

Background

To increase programming precision and to avoid over-programming, certain types of non-volatile memory are typically programmed using a sequence of program pulse and verify (PV) cycles. Flash memory and resistive random access memory ("ReRAM") are two types of memory that often require the use of numerous consecutive PV cycles for programming. Each PV cycle typically includes a program pulse that incrementally increases the charge stored on the floating gates of memory cells by applying a program voltage to the memory cells for some duration, as well as a verify operation that determines whether the memory cells have been properly programmed. More specifically, during execution of a program command in a flash memory array, a first PV cycle is initiated that applies a first program pulse to the control gates of the addressed floating gate memory cells to incrementally program data therein, and then the contents of the addressed memory cells are examined to verify that the addressed memory cells are properly programmed. Any memory cells that are not properly (e.g., completely) programmed during the first PV cycle are identified, and then a second PV cycle is initiated for those identified memory cells. This process is repeated until all the memory cells addressed by the program command are completely programmed with the program data.

Once the sequence of PV cycles associated with a program command is initiated, all memory cells in the memory array are typically unavailable for other operations (e.g., read operations) until execution of the program command is complete.

Thus, there is a need for non-volatile memory that can be accessed in a faster and more efficient manner during programming operations.

BRIEF DESCRIPTION OF THE DRAWINGS

The present embodiments are illustrated by way of example and are not intended to be limited by the figures of the accompanying drawings, where:

FIG. 3A depicts a plurality of independently executable fractional program commands stored in the command queue of FIG. 1A;

FIG. 3B depicts a non-program command inserted at the top of the command queue of FIG. 1A;

FIG. 3C depicts a non-program command inserted after a first fractional program command in the command queue of FIG. 1A;

FIG. 4A depicts a plurality of separate and independently executable program pulse and verify commands stored in the command queue of FIG. 1A;

FIG. 4B depicts a non-program command inserted between a program pulse and a corresponding verify command in the command queue of FIG. 1A;

FIG. 4C depicts commands in a command queue similar of FIG. 1A;

Like reference numerals refer to corresponding parts throughout the drawing figures.

DETAILED DESCRIPTION

Figure 1A:
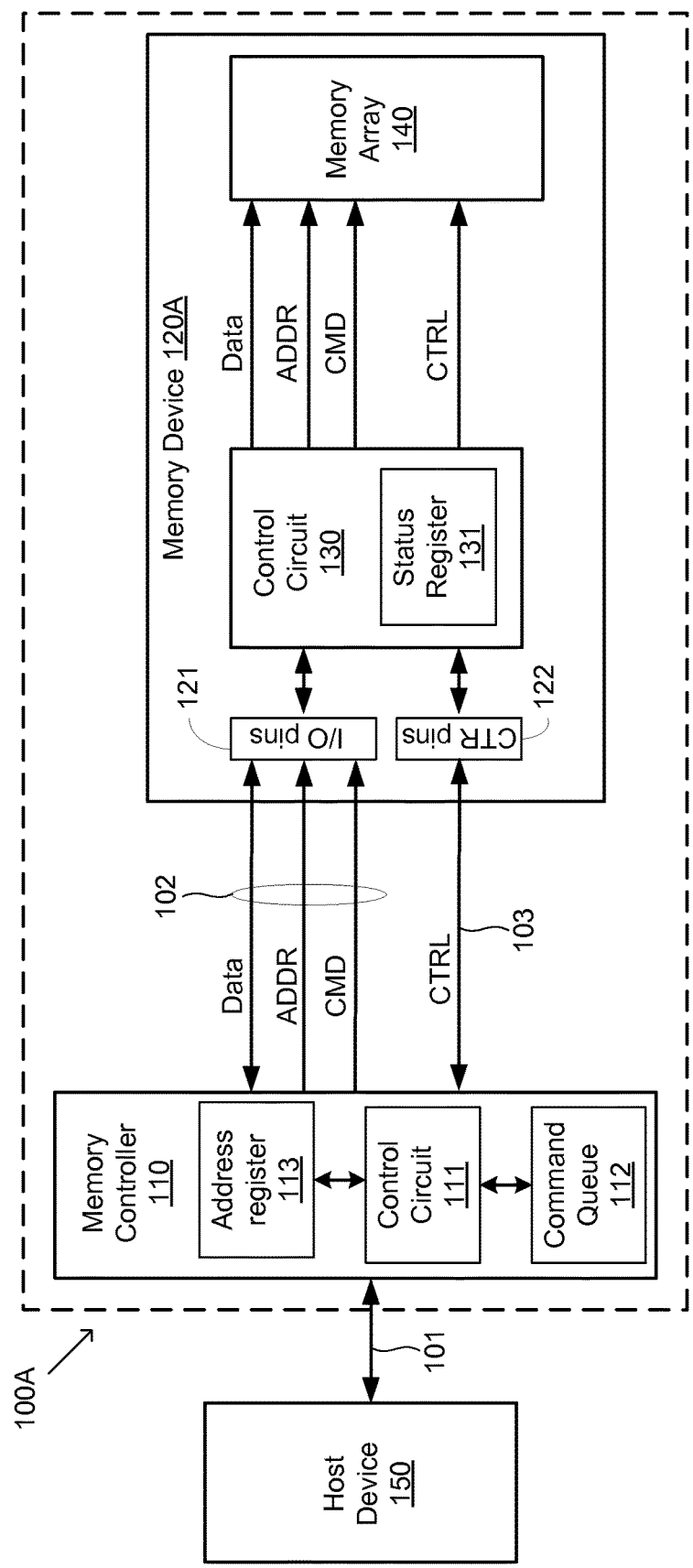
FIG. 1A shows a simplified block diagram of a memory system including a memory controller and a memory device.

A method of programming data into a memory device including an array of memory cells is disclosed. The method comprises receiving at least one program command that addresses a number of the memory cells for a programming operation to program data in the memory cells. The at least one program command is executed by iteratively carrying out at least one program/verify cycle to incrementally program the addressed memory cells with the program data. A secondary command may be selectively received after initiating but before completing the programming operation. The interrupted programming operation may be selectively resumed by first verifying the memory cells, then carrying out at least one program/verify cycle.

In a further embodiment, a memory system is disclosed that allows an array of memory cells to be accessed and otherwise utilized during a programming operation. In accordance with some embodiments, the programming operation is performed using a plurality of separate, independently executable fractional program commands that can be selectively provided to the array of memory cells in a pipelined manner via a command pipeline. Other non-program commands (e.g., read commands, erase commands, and so on) can be selectively inserted into the command pipeline between the fractional program commands so that the non-program commands can be executed in the memory array while the programming operation is in progress without interrupting execution of any of the fractional program commands.

In an additional embodiment, a non-volatile memory device is disclosed that includes an array of non-volatile memory cells. The device employs command interface logic to receive at least one program command. The program command initiates respective program and verify operations for programming each cell by incrementally increasing a program voltage for each cell and verifying a cell voltage against a threshold value. Each program and verify operation collectively defines a program/verify cycle. A program state register stores program information for a most-recent program/verify cycle. The command interface logic selectively receives a secondary command after initiation but prior to completion of the programming such that, before completion of the programming, the program state register stores the most-recent program information for the memory cells. By resuming with a verify operation, or command, device registers may be freed from storing data during the program operations, and thus available to carry out temporary storage functionality during, for example, the secondary command.

As used herein, the term "non-volatile" refers to memory that retains data for an appreciable time after power loss, thereby enabling a host system to be powered off (power supplies fully discharged) and then back on (a power cycle) with a full expectation of data retention. Examples of non-volatile semiconductor memory technologies may include flash memory, phase change memory, resistance change memory, FRAM (ferroelectric RAM), MRAM (magnetic RAM) and other similar solutions. "Flash" memory includes both NAND and NOR core cell structures as well as floating gate and charge-trapping technologies (e.g. Silicon-Oxide-Nitride-Oxide-Silicon or "SONOS" technology.) Various effects from either aging or wear may lead to a semiconductor memory cell having progressively reduced retention interval, such that a particular memory may ultimately change in character from non-volatile to volatile.

Though discussed in the context of flash memories, the embodiments described herein can be extended to any technologies that rely on multiple steps which incrementally program a semiconductor memory cell (e.g., erase before write, multiple program steps, use of PV cycles, etc.), on significant programming time, or on programming in minimum unit sizes.

For many of the exemplary memory systems described herein, a control circuit associated with the memory array creates a plurality of fractional program commands in response to a program command (e.g., received from an external source such as a host device, a host controller, a microprocessor, control software, and so on) that addresses a number of the array's memory cells for a programming operation to program data therein. The fractional program commands, which can be stored in a command queue (e.g., associated with the control circuit), are selectively provided to the memory array as independently executable commands via the command pipeline. In response to each fractional program command, a program pulse is applied to the control gates of the memory cells addressed by the program command to incrementally program data therein, and a verify operation is performed to verify that the addressed memory cells have been properly programmed. Verify data can be generated to indicate the results of the verify operation. If the verify data indicates that additional program pulses are needed, the control circuit can then apply the next fractional program command to the memory array. Conversely, if the verify data indicates that all the addressed memory cells are properly programmed, the control circuit can terminate the programming operation. In some embodiments, a verify operation may be performed first in response to a fractional program command. For some embodiments, the control circuit can be provided within the memory device. For other embodiments, the control circuit can be provided within a memory controller coupled to the memory device.

The duration of the program pulse associated with each fractional program command is a selected fraction of the total programming time typically required to program the memory cells. Therefore, executing each fractional program command of the present embodiments requires only a fraction of the time necessary to perform the entire programming operation, and therefore requires only a fraction of the time typically required to execute a conventional program command (e.g., that applies a continuous sequence of PV cycles to the memory array). Accordingly, by selectively providing the fractional program commands to the memory array as separate, independently executable commands in a pipelined manner, the control circuit can retain control of and schedule the application of individual program pulses to the addressed memory cells during programming operations. As a result, the control circuit can schedule the execution of a secondary or non-program command in other portions (e.g., other pages) of the memory array not addressed by the program command while the programming operation is in progress by inserting the non-program command ahead of one or more of the fractional program commands in the command pipeline. For example, while a programming operation addressing a page of a flash memory array is in progress, data can be quickly read from memory cells in other pages of the memory array by inserting a read command ahead of all yet-to-be executed fractional program commands in the command pipeline. Resuming the program operation may involve carrying out a program command following the non-program command, and utilizing program data already stored in a data buffer, or asserting a verify command before a program command to read the contents of the interrupted page, and proceeding from the interrupted point in the prior programming operation. In one embodiment, the interrupted program operation may be repeated entirely, rather than involve storing the program data in the buffers. In other embodiments, program commands may be partial program commands such that no interruptions to program commands occur (any interruption is thus with respect to an array programming operation).

Although programming operations are sometimes described herein as addressing one or more pages of memory, other minimal units of storage area of the memory array can be addressed, depending upon the organization of the memory cells within the memory array.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) that may be used to transfer such formatted data and/or instructions through wireless, optical, or wired signaling media or any combination thereof. Examples of transfers of such formatted data and/or instructions include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs. These computer programs may include, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

FIG. 1A shows a simplified block diagram of an exemplary memory system 100A. The memory system 100A includes a flash memory controller 110 and a flash memory device 120A, and is connected to a host device 150. The flash memory controller 110 and the flash memory device 120A are formed on the same integrated circuit (IC) chip, as depicted in FIG. 1A. For other embodiments, the flash memory controller 110 and the flash memory device 120A can be formed on separate IC chips.

The host device 150 can be any suitable host device or controller that provides commands to the flash memory controller 110 for execution in the flash memory device 120A. For example, the host device 150 can be the host controller in a computer system that controls communication between a central processing unit (CPU) and the flash memory system. The host device 150 can execute software that implements one or more of the present embodiments, as described in more detail below.

The flash memory controller 110 includes a first port connected to the host device 150 via a connection 101, and a second port connected to the flash memory device 120A via input/output (I/O) buses 102 and a control bus 103. The I/O buses 102 include a data bus for transmitting data (DATA) between the flash memory controller 110 and the flash memory device 120A, an address bus for providing address information (ADDR) to the flash memory device 120A, and a command pipeline for providing commands (CMD) to the flash memory device 120A. The control bus 103 routes control signals (CTRL) between the flash memory controller 110 and the flash memory device 120A. For other embodiments, some of the I/O buses 102 and/or the control bus 103 can be combined. Further, although not shown for simplicity, clock and other control signals can be sent from the flash memory controller 110 to the flash memory device 120A via the control bus 103.

The flash memory controller 110 also includes a control circuit 111, a command queue 112, and a program address register 113. Control circuit 111 receives commands from the host device 150, and in response thereto generates and transmits commands and associated control signals to the memory device 120A. For some embodiments, commands generated by the control circuit 111 can be queued in a desired order of execution in the command queue 112, and thereafter selectively provided to the memory device 120A in a pipelined manner via the command pipeline. The command queue 112 can be any suitable queue, register file, or other storage element. The program address register 113, which is coupled to the control circuit 111, can maintain an address list that indicates which pages of memory cells in the memory device 120A are currently being programmed.

For exemplary embodiments described herein, the host device 150 and the flash memory controller 110 are separate devices, as illustrated in FIG. 1A. However, for other embodiments, the flash memory controller 110 can be included within the host device 150, for example, so that the command queue 112 and the program address register 113 are included within and directly controlled by the host device 150. For such embodiments, operating software executed by the host device 150 can control the creation and issuing of fractional program commands to the memory device 120A.

The memory device 120A includes I/O pins 121, control pins 122, a control circuit 130, and a flash memory array 140. The I/O pins 121 connect the control circuit 130 to the flash memory controller 110 via the I/O buses 102, and the control pins 122 connect the control circuit 130 to the flash memory controller 110 via the control bus 103. The memory array 140 can be any well-known memory array that includes a plurality of memory cells and associated control circuits (not shown in FIG. 1A for simplicity). For example, the memory array 140 can include flash memory cells arranged in a NAND, NOR, or other suitable configuration. For exemplary embodiments described herein, the memory cells of memory array 140 are floating gate transistors that can be programmed by applying a plurality of program pulses to their control gates, where each program pulse is a suitably high program voltage that incrementally increases the threshold voltage Vt of the memory cells selected for programming. For other embodiments, the memory array 140 can include other types of non-volatile memory cells such as EPROM cells, EEPROM cells, and/or charge trapping device memory cells (e.g., SONOS flash cells). Further, the memory cells of the array 140 can be physically and/or logically divided into any number of banks, blocks, segments, sectors, or pages that can be independently operated. Moreover, although shown in FIG. 1A as including one memory array 140, the memory device 120A can include a plurality of memory arrays 140.

The control circuit 130, which is coupled to the I/O pins 121, to the control pins 122, and to the memory array 140, is configured to control operations (e.g., programming, reading, and erasing operations) to the memory array 140 in response to commands and/or control signals received from the flash memory controller 110. The control circuit 130 also includes a status register 131 that stores status data indicating the progress of various operations in the memory array 140. The status register 131 can also store verify data that indicates the results of program verify operations in the memory array 140. The verify data can indicate whether the application of additional program pulses is needed to complete the programming operation, and can also include other information such as, for example, which memory cells are properly programmed, which memory cells are require additional programming, the number of program pulses already applied, and so on.

In addition, for some embodiments, during execution of a command in the memory array 140, the control circuit 130 can assert a busy signal to alert the memory controller 110 that the memory device 120A is not available, and upon completion of the command, the control circuit 130 can assert a ready signal to alert the memory controller 110 that the memory device 120A is ready to accept another command. The busy and ready signals may be transmitted by way of a separate signal on the control bus 103.

In accordance with present embodiments, the flash memory controller 110 is configured to control and selectively schedule the application of each of a plurality of individual program pulses to the memory cells of array 140 addressed by a programming operation. To initiate the programming operation in the memory array 140, the host device 150 issues a program command to the flash memory controller 110 and loads the to-be-programmed data into memory (via a common or independent operation). The program command includes the addresses of the memory cells selected for programming. Typically, the smallest unit of storage area in the flash memory array 140 that can be selected for a programming operation is a page of memory cells. In some embodiments, in response to the program command, the flash memory controller's control circuit 111 creates a number of fractional program commands that collectively embody the programming operation. Each fractional program command is an independent command that instructs the flash memory device 120A to apply a program pulse to the addressed memory cells for a duration that is a selected fraction of the time typically required to completely program the memory cells. The fractional program commands can be queued in a desired order of execution in the command queue 112, and then transmitted to the flash memory device 120A as individually executable commands via the command pipeline CMD. For some embodiments, the control circuit 111 selectively transmits the fractional program commands to the flash memory device 120A in response to the verify data generated by the flash memory device 120A.

For some embodiments, the program address register 113 can store the page addresses associated with programming operations in progress. In this manner, the control circuit 111 can quickly determine which pages of memory cells in the array 140 are undergoing programming operations by accessing the program addresses stored in the program address register 113.

When the flash memory device 120A receives a fractional program command from the flash memory controller 110, its control circuit 130 applies a program pulse of a predetermined duration to the control gates of the addressed memory cells of the memory array 140 to incrementally program data therein. As mentioned above, the program pulse has a duration that is a fraction of the time typically required to completely program the memory cells, and therefore execution of each fractional program command requires only a fraction of the time required to perform the entire programming operation to the memory device 120A. After application of the program pulse to the addressed memory cells, the control circuit 130 performs a verify operation to determine whether any of the addressed memory cells require additional program pulses.

In some embodiments, if the verify operation identifies any of the addressed memory cells that require additional programming, the control circuit 130 can de-assert a verify signal, and in response thereto the flash memory controller 110 can send the next fractional program command (e.g., queued in command queue 112) to the flash memory device 120A. The next fractional program command causes the control circuit 130 to apply another program pulse to the identified memory cells to further program data therein, and to perform another verify operation. This process is repeated until all of the addressed memory cells are properly programmed. When the verify operation indicates that all the addressed memory cells are properly programmed, the control circuit 130 can assert the verify signal. In response thereto, the flash memory controller 110 does not send additional fractional program commands associated with the programming operation to the flash memory device, and the programming operation is terminated. Further, upon completion of the programming operation, the control circuit 111 can remove the corresponding program address from the program write register 113.

If a non-program command (e.g., a read command) is received by the flash memory controller 110 during the programming operation, its control circuit 111 can selectively insert the non-program command into any location in the command queue 112. For some embodiments, upon receiving the non-program command, the control circuit 111 accesses the program address register 113 and compares the program addresses stored therein with the address associated with the non-program command to determine whether the memory page addressed by the non-program command is currently being programmed with data. If there is not a match, which indicates that the memory page addressed by the non-program command is not currently being programmed, the control circuit 111 can insert the non-program command in the command queue 112.

The non-program command provided by the host device 150 can include priority information that indicates the priority of the non-program command relative to any programming operation being performed in the memory device 120A. For one example, if the priority information indicates a highest priority, the control circuit 111 can insert the non-program command at the top of the command queue 112 (e.g., ahead of any remaining fractional program commands previously queued therein) so that upon completion of the current fractional program command, the non-program command is sent to the memory device 120A for immediate execution therein. For another example, if the priority information indicates a lowest priority, the control circuit 111 can insert the non-program command at the bottom of the command queue 112 (e.g., after all remaining fractional program commands previously queued therein) so that the non-program command is sent to and executed by the memory device 120A after completion of the entire programming operation. Alternatively, the control circuit 111 can be configured to automatically insert the non-program command at the top of the command queue 112.

Conversely, if there is a match with a program address stored in the program address register 113, which indicates that the memory page addressed by the non-program command is currently being programmed, the control circuit 111 can "hold" the non-program command until the programming operation to the addressed memory page is complete (e.g., as indicated by the removal of the corresponding address entry in the program address register 113), and thereafter insert the non-program command at the top of the command queue 112. In this manner, the memory cells of the array 140 being programmed are not accessed for data retrieval until the programming operation is complete, thereby preventing the retrieval of partially programmed (e.g., and therefore possibly incorrect) data from the memory array 140. Alternatively, a copy of the data being programmed in the memory cells may be temporarily stored for access while the programming operation is in progress.

By creating a plurality of individual fractional program commands in response to a single program command received from the host device 150, the programming operation is effectively divided into a number of shorter, independently executable commands that each tie up the memory device 120A for less time than would the original program command. In this manner, the memory controller 110 can selectively schedule the execution of non-program commands in the memory device 120A during programming operations thereto, which in turn allows the memory controller 110 to quickly access some portions of the memory device 120A during programming operations to other portions of the memory device 120A. For example, by inserting a read command ahead of a number of fractional program commands previously queued in the command queue 112, the read command can be sent to and executed in the flash memory device 120A before the fractional program commands. In this manner, data can be read from some pages of the memory array while a programming operation to other pages of the memory array is in progress without interrupting the execution of any of the fractional program commands associated with the programming operation.

In addition, the ability to selectively schedule the execution of non-program commands in the flash memory device during programming operations can maximize utilization of the flash memory device 120A. For example, during a programming operation to a selected page of memory cells, if a series of read commands are received that address data stored in other pages of memory cells, the read commands can be sent to and executed in the flash memory device 120A immediately upon completion of the current fractional program command. Thereafter, any remaining fractional program commands associated with the programming operation can be executed in the flash memory device while the retrieved data is being processed (e.g., by the host device 150), thus resuming the programming operation. For some embodiments, more fully described below, resuming programming involves first verifying the memory array or retrieving state information indicating, for example, voltage pulse durations, voltage levels, or other parameters associated with the array at the time of program interruption. In this manner, the programming operation can be completed in the flash memory device 120A while the host device 150 is processing the retrieved data, thereby minimizing idle time of the flash memory device 120A. Further, by verifying or retrieving the state of the interrupted programming process, overprogramming the array may be avoided. In other embodiments, the fractional program commands may comprise partial program commands to partially program cells in the array. Execution of intervening secondary or non-program commands thus do not interrupt a given program command.

As mentioned above, during a programming operation, the flash memory device 120A generates program result verify data that indicates whether the memory cells have been properly programmed. For some embodiments, the flash memory controller 110 can read the verify data from the flash memory device's status register 131 during the programming operation (e.g., after the verify operation of each fractional program command associated with the programming operation). For other embodiments, the flash memory device 120A can be configured to send a verify signal to the flash memory controller 110A upon completion of each fractional program command. For example, if the verify operation identifies any of the memory cells addressed by the program command that are not completely programmed after application of the corresponding program pulse, the flash memory device 120A can de-assert the verify signal to instruct the flash memory controller 110 to send the next fractional program command to the flash memory device 120A. Conversely, if the verify operation does not identify any un-programmed memory cells in the array 140, the flash memory device 120A can assert the verify signal to alert the flash memory controller 110 that the programming operation is complete, that additional fractional program commands are not needed, and that the page addresses corresponding to the programming operation can be removed from the program address register 113. In this manner, the flash memory controller 110 may be continually alerted to the incremental progress of each programming operation within the flash memory device 120A. This is in contrast to conventional flash memory systems in which the flash memory controller delegates the entire programming operation to the flash memory device, during which the entire flash memory array is typically unavailable until the whole programming operation is completed.

In other embodiments, the flash memory device 120A can be configured to send a verify signal or command prior to each program command, or prior to program commands occurring as a result of a previously interrupted program operation. Carrying out such a verify-before-program methodology allows the memory device to free up its data buffer resources for other operations that may or may not occur concurrent with the program operation. As a result, the memory device may operate more efficiently with fewer page register resources, avoiding the need for additional register hardware. Also, as noted above, verifying before programming avoids unnecessarily overprogramming the memory array. Other embodiments may provide even further control over programming by employing different program commands. For example, a first program command type might, when executed, always begin with a verify operation. A second command type, when executed, might begin with a program operation instead of a verify operation. A further type of command might be employed to, when executed, signal a program resume sequence of operations, beginning with a verify operation and followed by subsequent program/verify cycles.

As mentioned above, the duration of the program pulse applied to the array's memory cells in response to each fractional program command is a fraction of the total program time typically required to completely program the memory cells of the array 140. The duration of each program pulse can be selected by a pulse width (PW) signal. The PW signal can be provided to the flash memory controller 110 with the program command, or alternately provided to the flash memory controller 110 or to the flash memory device 120A by another suitable circuit. For one example, the PW signal can specify a predetermined duration for the program pulse generated in response to each fractional program command. For another example, the flash memory controller 110 and/or the flash memory device 120A can be configured to incrementally increase the program pulse duration for sequential fractional program commands associated with a singular programming operation.

Further, for some embodiments, the program command sent to the flash memory controller 110 by the host device 150 can specify how many fractional program commands are to be executed in the flash memory device 120A in response to the program command. For one embodiment, the memory controller 110 can send a fixed number of fractional program commands to the flash memory device 110A. For another embodiment, the memory controller 110 can be configured to send a minimum number of fractional program commands to the flash memory device 120A prior to checking the status of the verify signal. For other embodiments, the program command sent to the flash memory controller 110 by the host device 150 can include a limit value (LIM) indicating a maximum number of fractional program commands that the flash memory controller 110 creates in response to the program command. For another embodiment, the flash memory controller 110 can be configured to create only one fractional program command in response to the program command received from the host device 150, and to subsequently create additional fractional program commands as necessary to properly program the array's memory cells (e.g., in response to the verify data).

In addition, the program command issued by the host device 150 can include grouping information that instructs the flash memory controller 110 to group a minimum number of fractional program commands together for execution in the flash memory device 120A, for example, to prevent an intervening non-program command from being inserted between the grouped fractional program commands in the command queue 112. The grouping of fractional program commands can ensure that the memory cells addressed for a programming operation are programmed by some predetermined minimal amount prior to the execution of a non-program command to other memory cells of the array 140 while the programming operation is in progress.

Figure 2A:
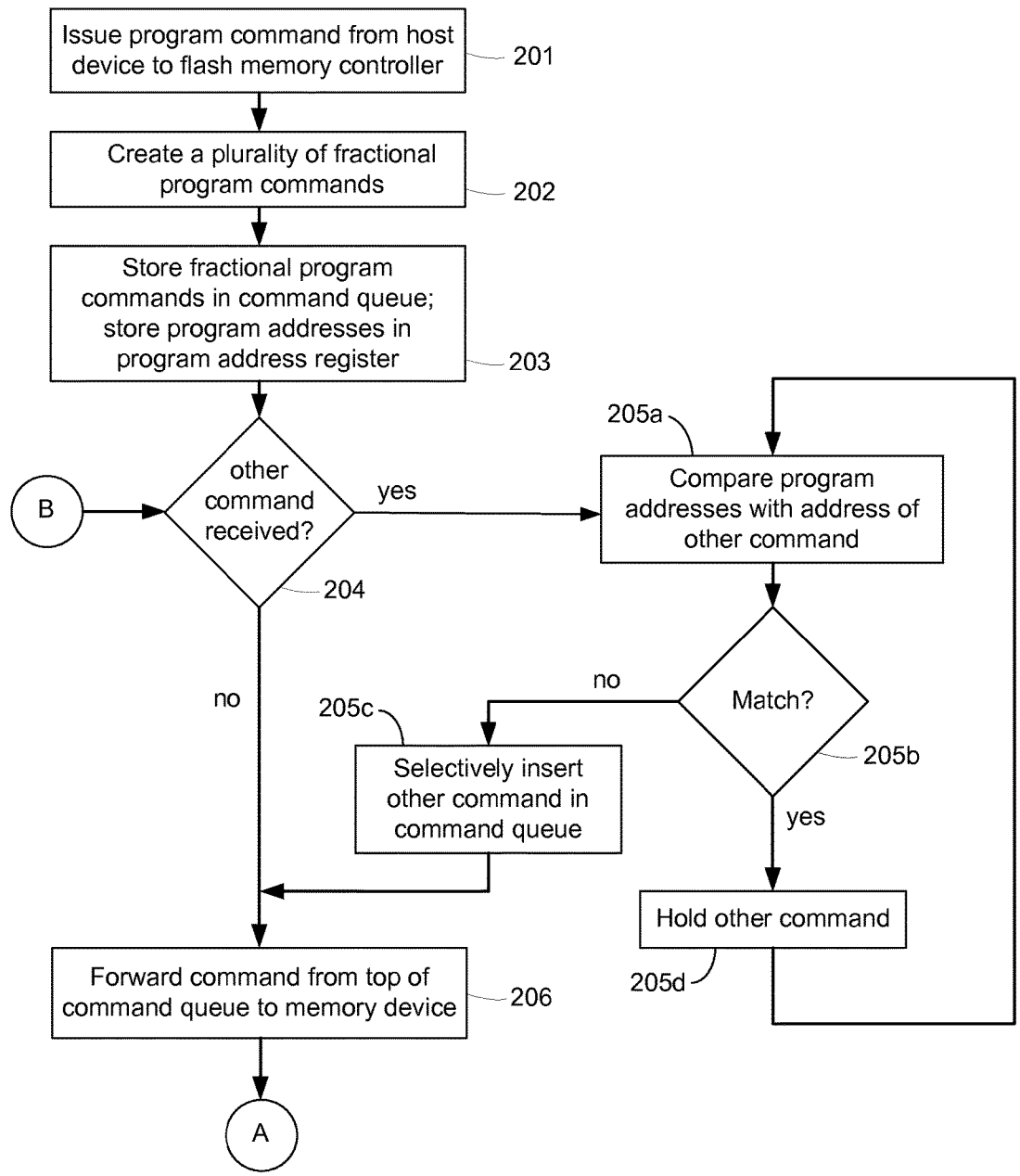
FIG. 2A is an illustrative flow chart depicting an exemplary method of creating a plurality of fractional program commands and creating a command queue.
Figure 2B:
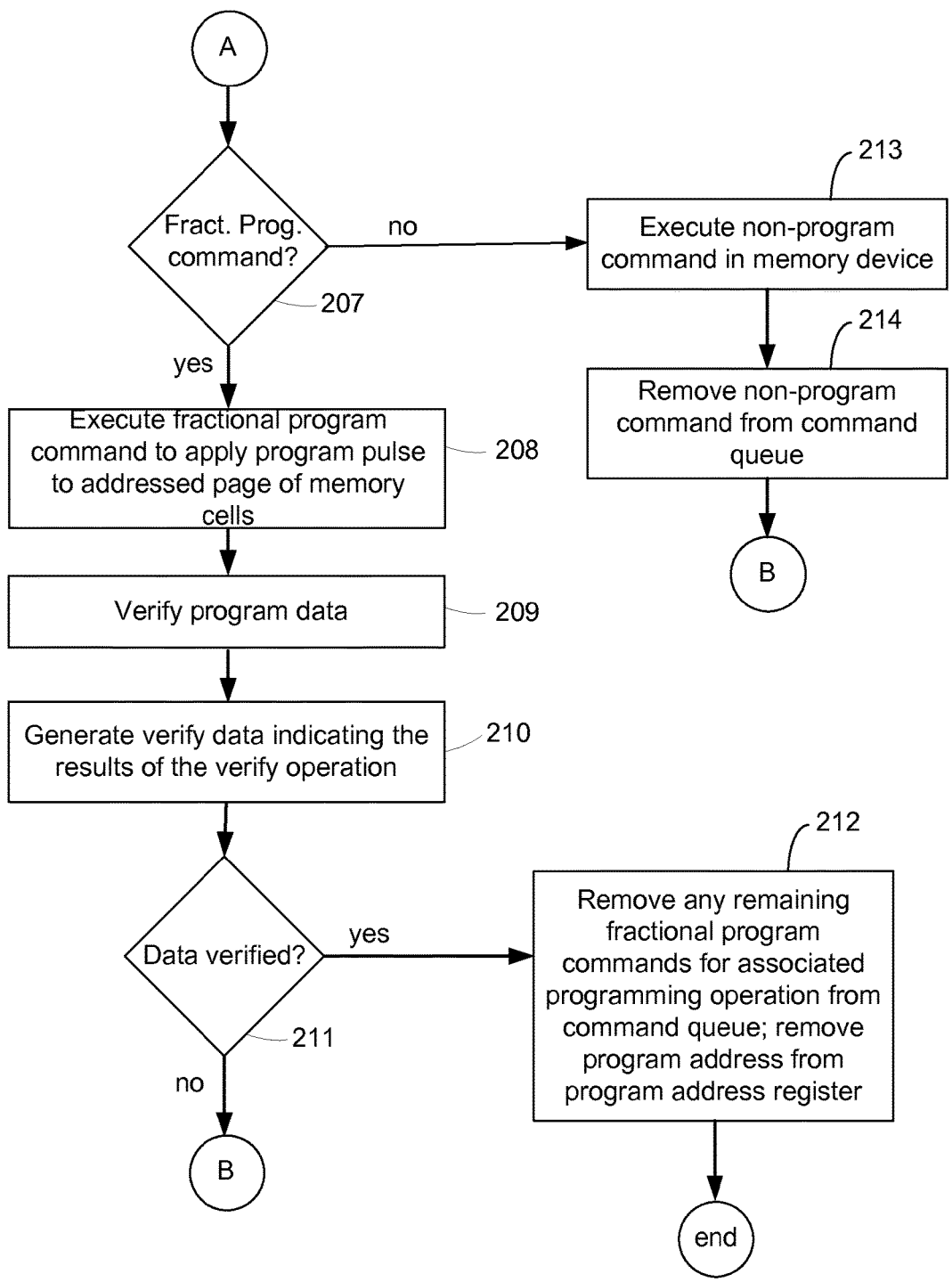
FIG. 2B is an illustrative flow chart depicting an exemplary method of operation of the memory device of FIG. 1A.

An exemplary operation of the flash memory device 120A is described below with respect to the illustrative flow chart of FIGS. 2A-2B. First, the host device 150 issues a program command that provides program data and address information to the flash memory controller 110 (step 201). In response thereto, the flash memory controller 110 creates a plurality of fractional program commands (step 202). As described above, execution of each independent fractional program command applies a single program pulse to the addressed memory cells in the memory array 140, where the duration of each program pulse represents a fraction of the total time typically required to program the array's memory cells. Then, the fractional program commands are stored in the command queue 112 in the desired order of execution, and the addresses of the memory cells to be programmed are stored in the program address register 113 (step 203). For example, FIG. 3A depicts a plurality of fractional program commands 301(1)-301(n) stored in corresponding locations 112(1)-112(n) of the command queue 112. FIGS. 3B, 3C, 4A, 4B and 4C illustrate similar commands and corresponding locations in the command queue 112.

If the flash memory controller 110 receives another, intervening non-program command (e.g., a read command or an erase command) from the host device 150, as tested at step 204, its control circuit 111 compares the program addresses stored in the program address register 113 with the address associated with the non-program command (step 205a). If there is not a match, as tested at step 205b, which indicates that the memory page addressed by the non-program command is not currently being programmed, the control circuit 111 selectively inserts the other command into the command queue 112 (step 205c).

For one example, FIG. 3B depicts a non-program command 302 inserted at the top of the command queue 112 ahead of all fractional program commands 301(1)-301(n). For another example, FIG. 3C depicts a non-program command 302 inserted between the first fractional program command 301(1) and the second fractional program command 301(2) in the command queue 112. As described above, for some embodiments, the flash memory controller 110 can be configured to selectively insert the non-program command at any location in the command queue 112 (e.g., as depicted in FIG. 3C), and for other embodiments the flash memory controller 110 can be configured to insert the non-program command at the top of the command queue 112 (e.g., as depicted in FIG. 3B).

Conversely, if there is a match with a program address stored in the program address register 113, as tested at 205b, which indicates that the memory page addressed by the non-program command is currently being programmed, the control circuit 111 "holds" the conflicting non-program command until the programming operation to the addressed memory page is complete (step 205d). For some embodiments, the control circuit 111 can include a buffer (not shown for simplicity) to hold the conflicting non-program commands. For one embodiment, a copy of the data being programmed in the memory cells may be temporarily stored for access while the programming operation is in progress.

Thereafter, the control circuit 111 can periodically poll the program address register 113 to determine whether the programming operation to the addressed memory page is complete (step 205b). If the programming operation is complete, the control circuit 111 can insert the non-program command into the command queue 112 (step 205c). Otherwise, the control circuit 111 continues to hold the conflicting non-program command (step 205d). Alternatively, the program address register 113 can send a completion flag to control circuit 111 when the programming operation to the addressed memory page is complete.

Then, the flash memory controller 110 forwards the command stored at the top of the command queue 112 to the flash memory device 120A (step 206). If the received command is a fractional program command, as tested at step 207, the memory device's control circuit 130 executes the fractional program command to apply a single program pulse to incrementally program data into the addressed memory cells of the array 140 (step 208), and then verifies the program data (step 209). Then, the flash memory device 120A generates verify data indicative of the results of the verify operation (step 210). FIG. 4C illustrates inserting a verify command 402 (*r*) before a fractional program pulse 401(2) to efficiently resume programming following a secondary or non-program command 302.

For some embodiments, the flash memory device 120A generates additional status information indicative of the progress of the programming operation (e.g., which memory cells have been completely programmed, which memory cells have not been completely programmed, how many program pulses have been applied to the memory cells, and so on). The verify data and/or the status information can be stored in the flash memory device's status register 131, as described above. Further, for some embodiments, the verify data can be used by the flash memory controller 110 to remove the corresponding fractional program command from the command queue 112 and to remove the program address from the program address register 113.

Also, for some embodiments, the flash memory device 120A can be configured to assert a busy signal during execution of each command in its memory array 140, and to assert a ready signal upon completion of the command. For such embodiments, the asserted busy signal can instruct the flash memory controller 110 not to send additional commands to the flash memory device 120A, and the asserted ready signal can alert the flash memory controller 110 that the flash memory device 120A is ready to accept additional commands.

If the verify data indicates that one or more of the addressed memory cells are not completely programmed, as tested at step 211, processing continues at step 204. For some embodiments, the flash memory device 120A can de-assert a verify signal that causes the flash memory controller 110 to send the next fractional program command to the flash memory device 120A. For other embodiments, the flash memory controller 110 can read the verify data from the flash memory device 120A. Otherwise, if the verify data indicates that all the memory cells in array 140 addressed by the program command are properly programmed, any remaining fractional program commands associated with the programming operation are removed from the command queue 112, and the corresponding program address is removed from the program address register 113 (step 212).

If the command received from the flash memory controller 110 is a non-program command, as tested at step 207, the flash memory device 120A executes the non-program command (step 213), the non-program command is removed from the command queue 112 (step 214), and processing continues at step 204. For example, if the non-program command is a read command, the flash memory device 120A executes the read command to read data from the memory cells in the array 140 addressed by the read command, provides the read data to the flash memory controller 110, and thereafter is ready to accept the next command from the command queue 112.

Figure 2C:
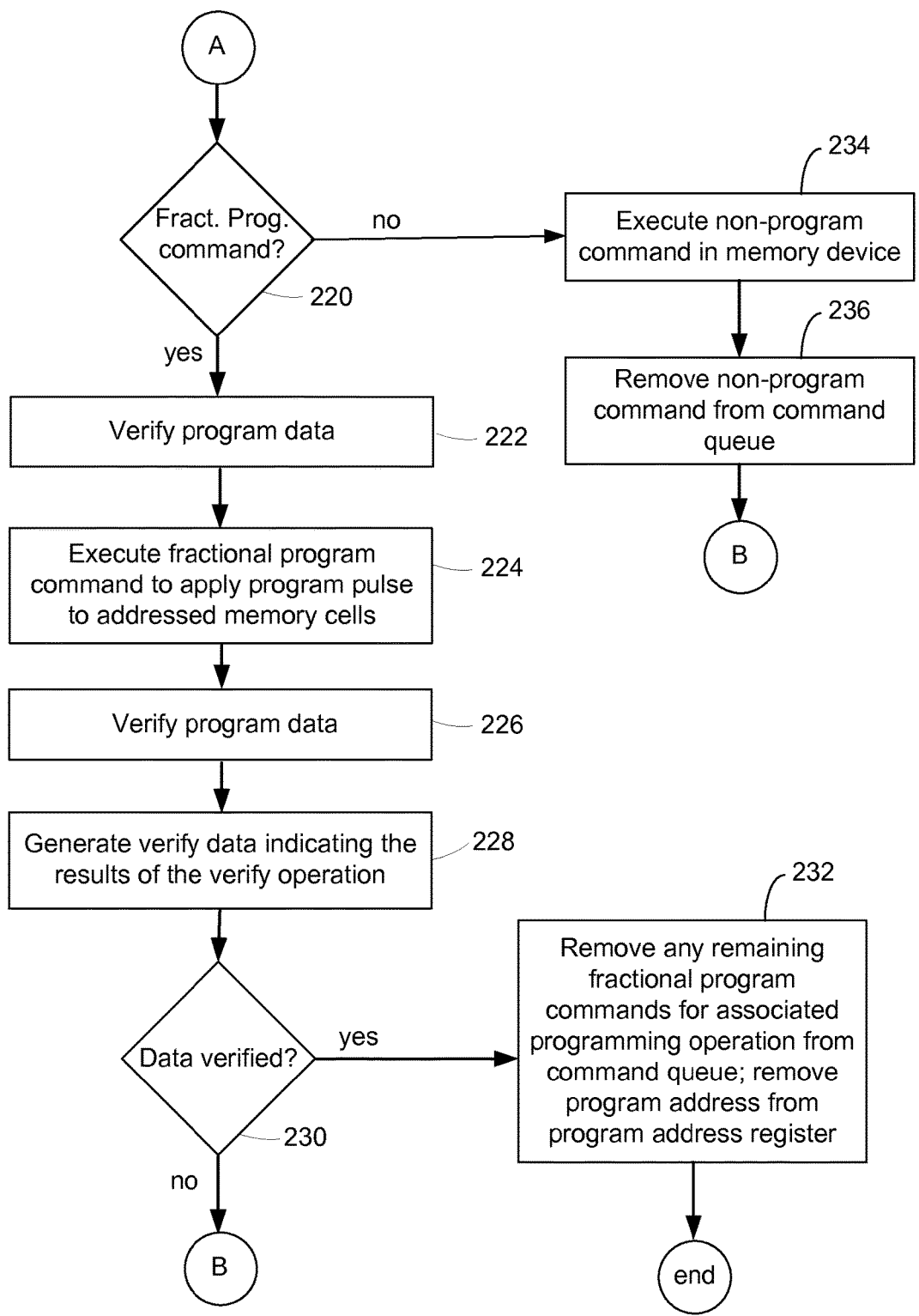
FIG. 2C is an illustrative flow chart depicting a method of operation of the memory device of FIG. 1A.

Referring now to FIG. 2C, in some embodiments, after determining whether the incoming command is a fractional program command, such as at step 220, a verify operation is asserted, at step 222. A verify operation generally compares the voltage on the cell to a target voltage level, which is typically different than a program voltage level. Asserting the verify operation at this time can be especially useful where, for example, a prior program operation was either programmed as a partial operation or interrupted to allow a higher priority read operation (non-program command) to take place. The verify-first step also relieves the memory device from having to store the unprogrammed data in a write buffer, leaving the buffer available for other uses, or enabling its reduction or removal altogether. Depending on the application, a verify operation may be asserted prior to a fractional program command in all cases, or the verify operation may be specified as a non-program command itself. Further, the verify step may even be specified as a flag in the program command.

Following the verify step, at 222, a fractional program command is executed at 224, followed by a subsequent verify step, at 226. Verify data is then generated, at step 228, indicating the results of the verify operation. If the data is verified, at block 230, then any remaining fractional program commands associated with the programming operation are removed from the command queue, at 232. If the data is unverified, then the steps relating to queuing other commands, such as steps 204 (FIG. 2A) and so on may take place.

If the detected command is not a fractional command, as determined at step 220, the non-program command is executed in the memory device, at step 234, and removed from the command queue, at step 236. Another command may then be received, such as at step 204 (FIG. 2A), and the command queuing process repeats.

For other embodiments, the flash memory controller 110 generates only one fractional program command in response to the program command received from the host device 150, and can selectively create and send additional fractional program commands to the flash memory device 120A if additional program pulses are required to properly program the addressed memory cells, in which case step 212 can be eliminated.

For the exemplary embodiments described above, each fractional program command instructs the flash memory device 120A to apply a single program pulse to incrementally program the addressed memory cells in the array 140 with the program data, and also instructs the flash memory device to perform a verify operation that compares the data stored in the memory cells being programmed with the original program data to determine whether any of the addressed memory cells require additional program pulses. For other embodiments, after a program operation has executed as a partial operation or been interrupted by a non-program command, programming resumes with a verify operation followed by a fractional program command. For yet other embodiments, each fractional program command generated by the flash memory controller 110 in response to a program command received from the host device 150 can instruct the flash memory device 120A only to apply the program pulse to the addressed memory cells. For such other embodiments, the flash memory controller 110 can be configured to generate a separate verify command associated with each fractional program command, where each verify command instructs the flash memory device 120A to verify the data programmed into the addressed memory cells by a corresponding fractional program command. The verify commands can be stored along with the fractional program commands in the command queue 112.

For example, FIG. 4A depicts storing a plurality of fractional program pulse commands 401(1)-401(n) and a corresponding plurality of separate verify commands 402(1)-402(n) in the command queue 112, where execution of each fractional program pulse command 401 applies a program pulse to the memory cells addressed for the programming operation, and execution of each verify command 402 verifies the results of the corresponding fractional program pulse command 401. FIG. 4B illustrates the insertion of a non-program command 302 between the first pair of fractional program pulse and verify commands 401(1)-402(1) and the second pair of fractional program pulse and verify commands 401(2)-402(2) in the command queue 112. Although it is possible to insert the non-program command 302 between a program pulse command 401 and its corresponding verify command 402, the verify command, in and of itself, is generally not very time consuming, and it may be architecturally preferred to complete a single PV cycle (including verification) before permitting an interleaved command.

For other embodiments, the host device 150 and/or software executed by the host device 150 can be configured to generate the fractional program commands associated with a programming operation, to queue the fractional program commands in a command queue, and to selectively send the fractional program commands to the flash memory device 120A in a pipelined manner (e.g., via flash memory controller 110). For such embodiments, the host device 150 and/or software executed by the host device 150 can be configured to selectively insert non-program commands such as read commands into any location in the command queue, for example, so that the non-program commands can be executed in the flash memory device 120A during a programming operation without interrupting the execution of any program-related commands.

Figure 1B:
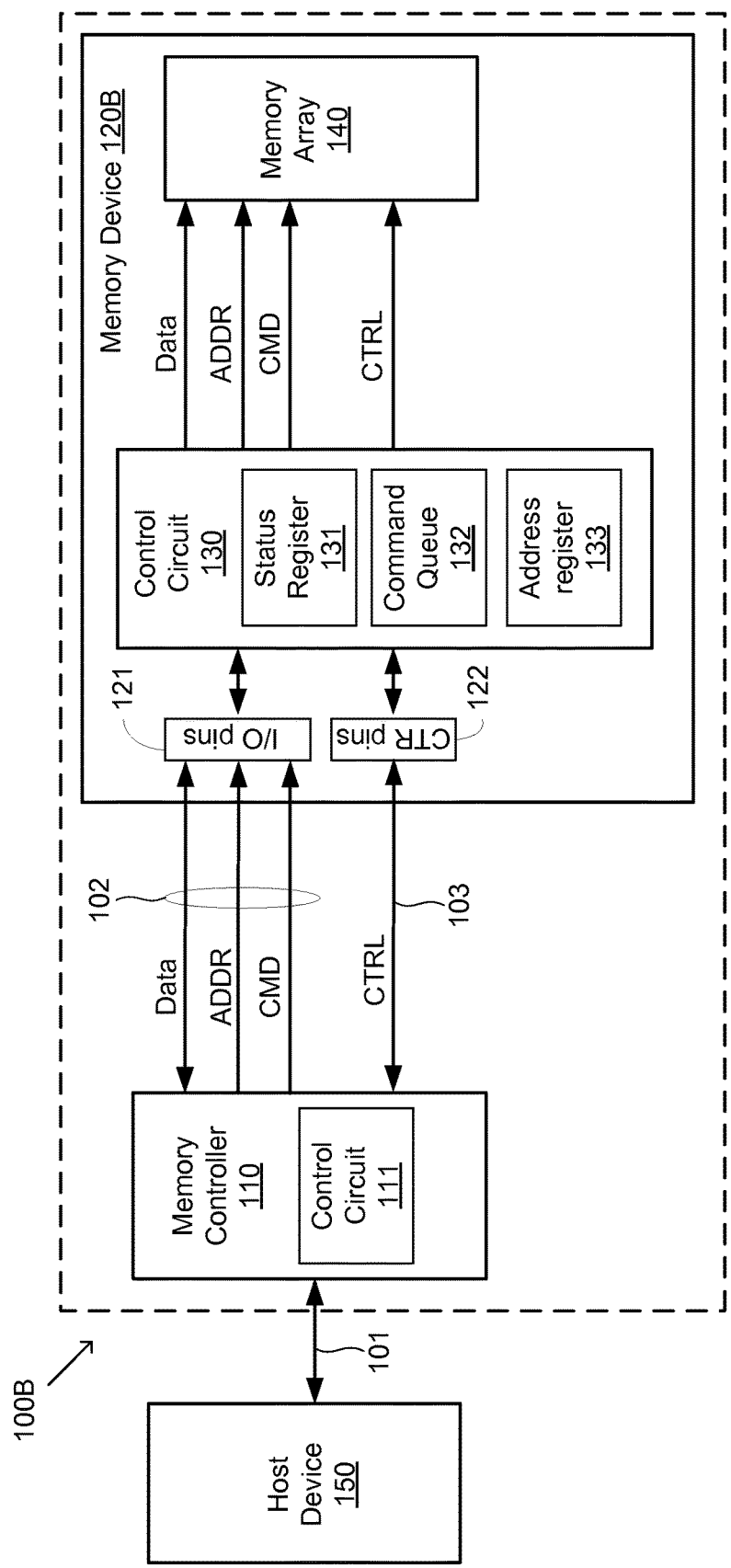
FIG. 1B shows a simplified block diagram of another memory system including a memory controller and a memory device.

For another embodiment, the flash memory device 120A can be configured to generate the fractional program commands in response to a programming command issued by the host device 150. For example, FIG. 1B shows a memory system 100B including the flash memory controller 110 and a flash memory device 120B in accordance with other embodiments. The flash memory device 120B is similar to the flash memory device 120A, except that the control circuit 130 of the flash memory device 120B includes a command queue 132 and a program address register 133. The command queue 132 and program address register 133 of FIG. 1B are similar to the command queue 112 and program address register 113 of FIG. 1A, respectively. For the embodiment of FIG. 1B, the memory device's control circuit 130 receives the program command issued by the host device 150 (e.g., via the flash memory controller 110), and in response thereto generates the fractional program commands. The flash memory controller can queue the fractional commands in the command queue 132 and, as needed, forward these commands to the memory array 140 to apply corresponding program pulses in a manner similar to that described above with respect to FIG. 1A. Thus, for the embodiments of FIG. 1B, the flash memory device's control circuit 130 controls the generation, scheduling, and execution of the fractional program commands for the memory array 140.

Figure 1C:
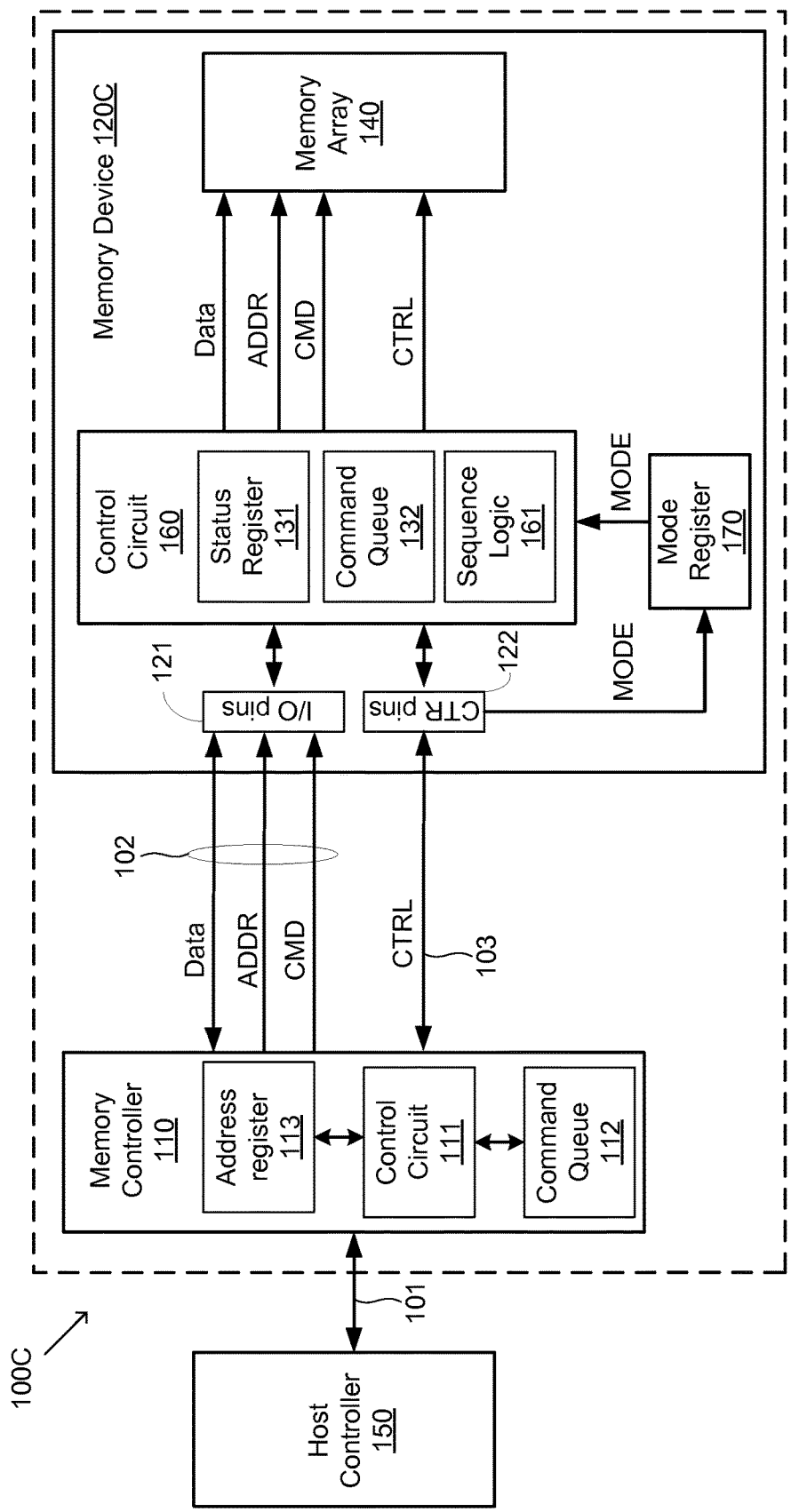
FIG. 1C shows a simplified block diagram of yet another memory system including a memory controller and a memory device.

Embodiments of the flash memory devices described above with respect to FIGS. 1A-1B are configured to execute a plurality of independent fractional program commands that collectively embody a programming operation to the memory cells of the array 140. For other embodiments, the flash memory device can include additional circuitry that can execute the program commands issued by the host device 150 in a conventional manner (e.g., by applying a sequence of continuous PV cycles to the memory cells addressed by the program command). For example, FIG. 1C shows a memory system 100C including the flash memory controller 110 and a flash memory device 120C. The flash memory device 120C includes a control circuit 160 and a mode register 170. Mode register 170, which can be any suitable storage element, is coupled to control circuit 160 and can be configured to store program mode data. The control circuit 160 includes all the elements of the control circuit 130 of FIG. 1B, and also includes well-known sequence logic 161 that allows the flash memory device 120C to receive and execute a program command (e.g., received from host device 150 via the flash memory controller 110) in a conventional manner. The program mode data can be generated by the host device 150, by the flash memory controller 110, or by any other suitable circuit. The mode data is used to instruct the flash memory device 120C whether to execute fractional program commands received from the flash memory controller 110, to create and execute fractional program commands in response to a program command received from the flash memory controller 110, or to implement conventional programming operations in response to a program command received from the flash memory controller 110. For some embodiments, the mode data is provided to the flash memory device 120C via the control pins 122 and stored in the mode register 170 (as depicted in FIG. 1C). For other embodiments, the mode data can be provided to and stored in the mode register 170 using dedicated pins (not shown for simplicity) or other suitable circuitry.

More specifically, when the program mode data is set to a first state to indicate a first fractional programming mode, the control circuit 160 is configured to receive a fractional program command from the flash memory controller 110. The control circuitry responsively applies a single program pulse to the addressed memory cells of the array 140 and performs a corresponding verify operation, for example, in the manner described above with respect to FIG. 1A. After execution of the fractional program command, the flash memory device 120C provides a verify signal to the flash memory controller 110 indicating whether additional fractional program commands are needed. The first state of the program mode data can also be used to disable the flash memory device's command queue 132, program address register 133, and sequence logic 161.

When the program mode data is set to a second state to indicate a second fractional programming mode, the control circuit 160 is configured to receive a conventional program command from the flash memory controller 110. In response thereto, the control circuit 160 generates one or more independently executable fractional program commands that can be queued in the memory device's command queue 132 and selectively provided to the memory array 140 for execution therein, for example, in the manner described above with respect to FIG. 1B. The second state of the program mode data can also be used to enable the memory device's command queue 132 and program address register 133, and to disable its sequence logic 161.

When the program mode data is set to a third state to indicate a conventional programming mode, the control circuit 160 is configured to receive a conventional program command from the flash memory controller 110, and in response thereto instructs the sequence logic 161 to initiate a sequence of PV cycles to program the addressed memory cells of the array 140 according to well-known techniques, during which the entire memory array 140 is typically unavailable. The third state of the program mode data can also be used to disable the flash memory device's command queue 132 and program address register 133, and to enable its sequence logic 161.

In this manner, the flash memory device 120C of FIG. 1C can perform programming operations either using fractional program commands in accordance with present embodiments or using conventional programming techniques, thereby allowing the flash memory device 120C to be employed in conventional memory systems or in memory systems configured in accordance with present embodiments.

Further, for other embodiments, the mode register 170 and associated control circuitry can be added to the flash memory device 120A of FIG. 1A so that the flash memory device 120A can either execute fractional program commands received from the flash memory controller 110 or perform conventional programming operations in response to a conventional program command received from the flash memory controller 110 (e.g., depending upon the state of the program mode data).

Figure 5A:
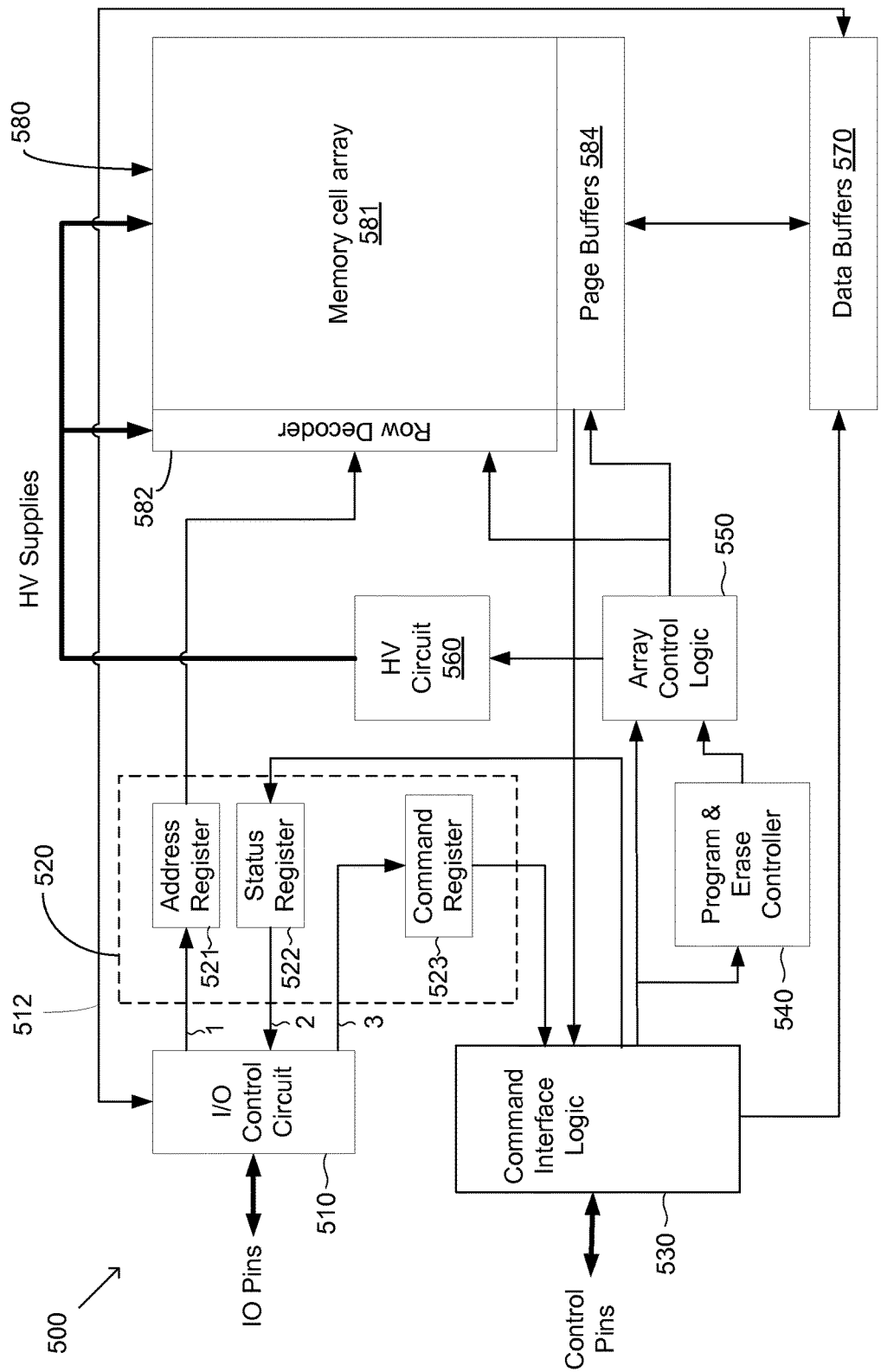
FIG. 5A shows a functional block diagram of one embodiment of the memory device of FIG. 1A.

FIG. 5A shows a functional block diagram of a flash memory device 500 that is one embodiment of the flash memory device 120A of FIG. 1A. The memory device 500 includes an I/O control circuit 510, a control register circuit 520, command interface logic 530, a program and erase controller 540, array control logic 550, a high-voltage circuit 560, data buffers 570, and a memory array 580. Together, the I/O control circuit 510, the control register circuit 520, the command interface logic 530, the program and erase controller 540, the array control logic 550, the high-voltage circuit 560, and the data buffers 570 form one embodiment of the control circuit 130 of FIG. 1A, and the memory array 580 forms one embodiment of the memory array 140 of FIG. 1A.

The I/O control circuit 510 is coupled to the memory device's I/O pins, to the control register circuit 520 via control lines 511-513, and to the data buffers 570 via data lines 514. The I/O control circuit 510, which is well-known, receives data to be programmed into the memory array 580 via the I/O pins, and provides data read from the memory array 580 to the I/O pins. The control register circuit 520 includes an address register 521, a status register 522, and a command register 523. The address register 521 is coupled to the memory array 580, the status register 522 is coupled to the command interface logic 530, and the command register 523 is coupled to the command interface logic 530.

Memory array 580 includes an array 581 of non-volatile memory cells (not shown for simplicity), a row decoder 582, and page buffers 584. The memory cells contained in the array 581 can be any suitable non-volatile memory cells such as, for example, those formed using floating gate transistors. The row decoder 582 selects a row of the memory cells for array operations (e.g., program and read operations) in response to address information provided by the address register 521. The page buffers 584 store data to be programmed into the memory array 581 during programming operations and store data read from the memory array 581 during read operations.

The command interface logic 530 is coupled to the device control pins, and is also coupled to the status register 522, to the program and erase controller 540, to the array control logic 550, to the data buffers 570, and to the page buffers 584. In operation, the command interface logic 530 receives the fractional program commands from the flash memory controller 110 (see also FIG. 1A), and in response thereto provides control signals to the array control logic 550, to the program and erase controller 540. The command interface logic 530 also responsively provides control over the data buffers 570 that generate and apply the program pulse to the memory cell array 581. For other embodiments, the command interface logic 530 includes or is associated with the command queue 132 (not shown in FIG. 5A), and is configured to create a plurality of fractional program commands in response to a program command received from the flash memory controller 110.

The program and erase controller 540 includes an input to receive control signals from the command interface logic 530 and includes an output to provide control signals to the array control logic 550. The array control logic 550 receives commands from the command interface logic 530 and control signals from the program and erase controller 540, and includes outputs coupled to the HV circuit 560, to the row decoder 582, and to the page buffers 584.

The HV circuit 560 includes inputs coupled to the array control logic 550, and includes outputs coupled to the memory array cells 581 and to the row decoder 582. The HV circuit 560 provides high-voltage signals to the memory array 580 during program and erase operations in response to control signals provided by the array control logic 550.

The data buffers 570 are coupled to the command interface logic 530 and to the I/O control circuit 510. In operation, the data buffers 570 receive control signals from the command interface logic 530, and either receive data from the I/O control circuit 510 during program operations or provide data read from the memory array 580 to the I/O control circuit 510 during read operations. The data buffers 570 are used to buffer data during program and read operations, for example, because the width of the data bus connected between the flash memory controller 110 and the I/O control circuit 510 is typically much less than the width of a memory page in the array 581. For example, in some embodiments, the memory device 500 can receive only one byte (e.g., eight data bits) at a time from the flash memory controller 110, and the page buffer 584 can be used as a cache to accumulate data for simultaneous page-sized program or read operations with the memory array 581. In other embodiments, data buffer 570 may be used as the cache to accumulate data, which may then be subsequently transferred to the page buffer 584.

Figure 5B:
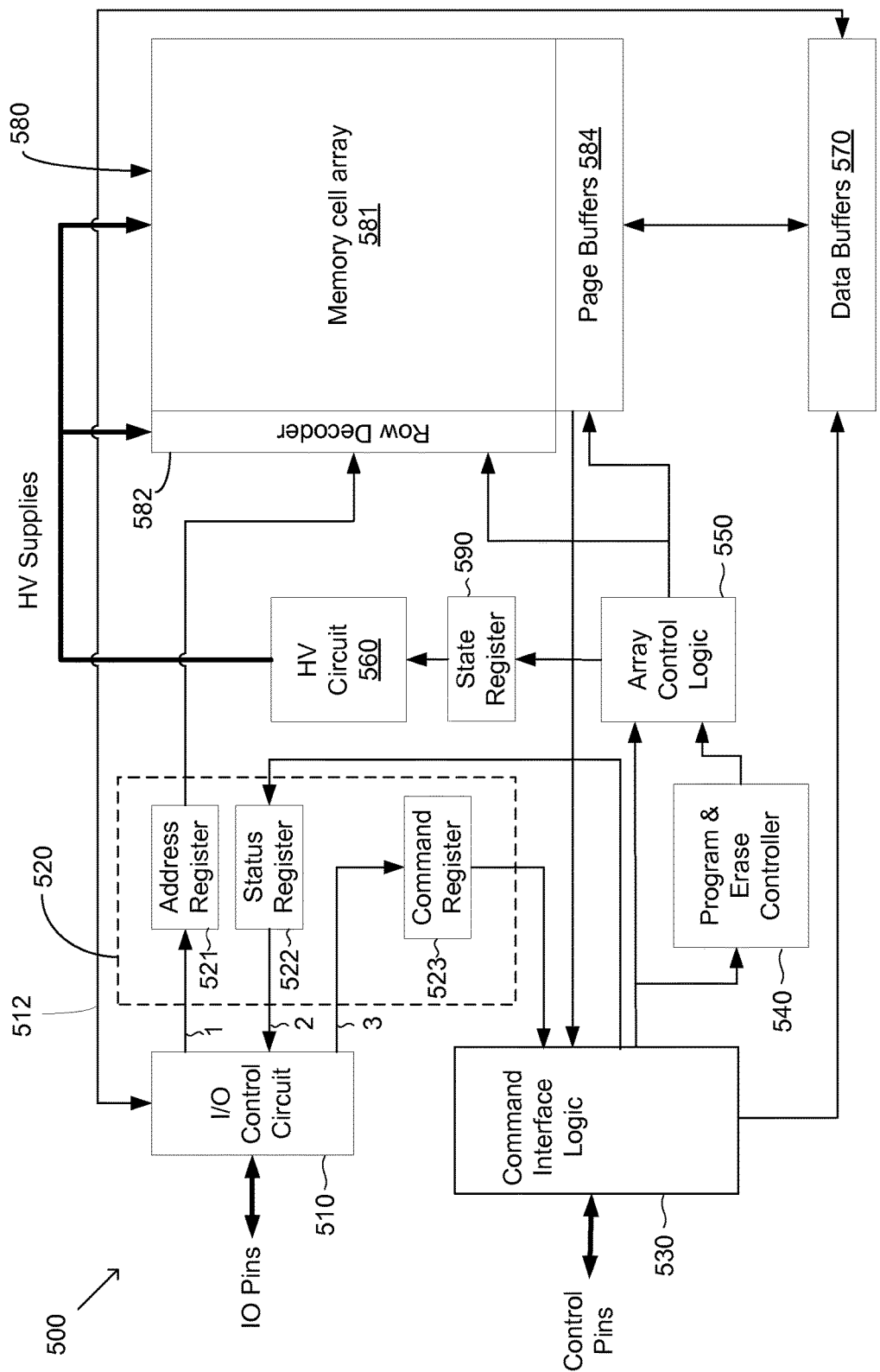
FIG. 5B shows a functional block diagram of another embodiment of the memory device of FIG. 1A.

FIG. 5B illustrates a functional block diagram of a flash memory device 590 that includes much of the circuitry and functionality of the embodiment shown in FIG. 5A, but with at least one additional feature. As described previously, by providing a verify-before-program operation or command, the flash memory device may avoid overprogramming the selected page of memory cells. This is because the verify step senses the states of the memory cells through the page buffers 584. The sensed data may then be transferred to the status register 522 or a pass/fail check circuit (not shown).

In an effort to avoid storing program data in either the data buffers 570 or page buffers 584 during interrupted programming operations, the embodiment of FIG. 5B employs one or more state registers 590 to store the most recent state information of a given page while the program operation is interrupted. In response to the initial verify command (such as the verify command 402(*r*) shown in FIG. 4C), the HV circuit 560 extracts the previous state information from the state register(s) 590, such as the last programming voltage used, or the number of program/verify cycles carried out during the last attempted programming operation. With the known state information, the appropriate voltage levels may be applied to the memory cell array 581 such that programming can resume approximately where it was interrupted.

Further referring to FIG. 5B, by employing a state register in the flash memory device, additional flexibility in carrying out write (or program) operations may be realized. Original data for writing into the selected page(s) may either be stored in the data buffers 570 (where it may be safely overwritten, if necessary), and/or resent from the controller in its entirety. Having this ability enables non-programming operations, such as read operations, to use the page registers as necessary.

Figure 6:
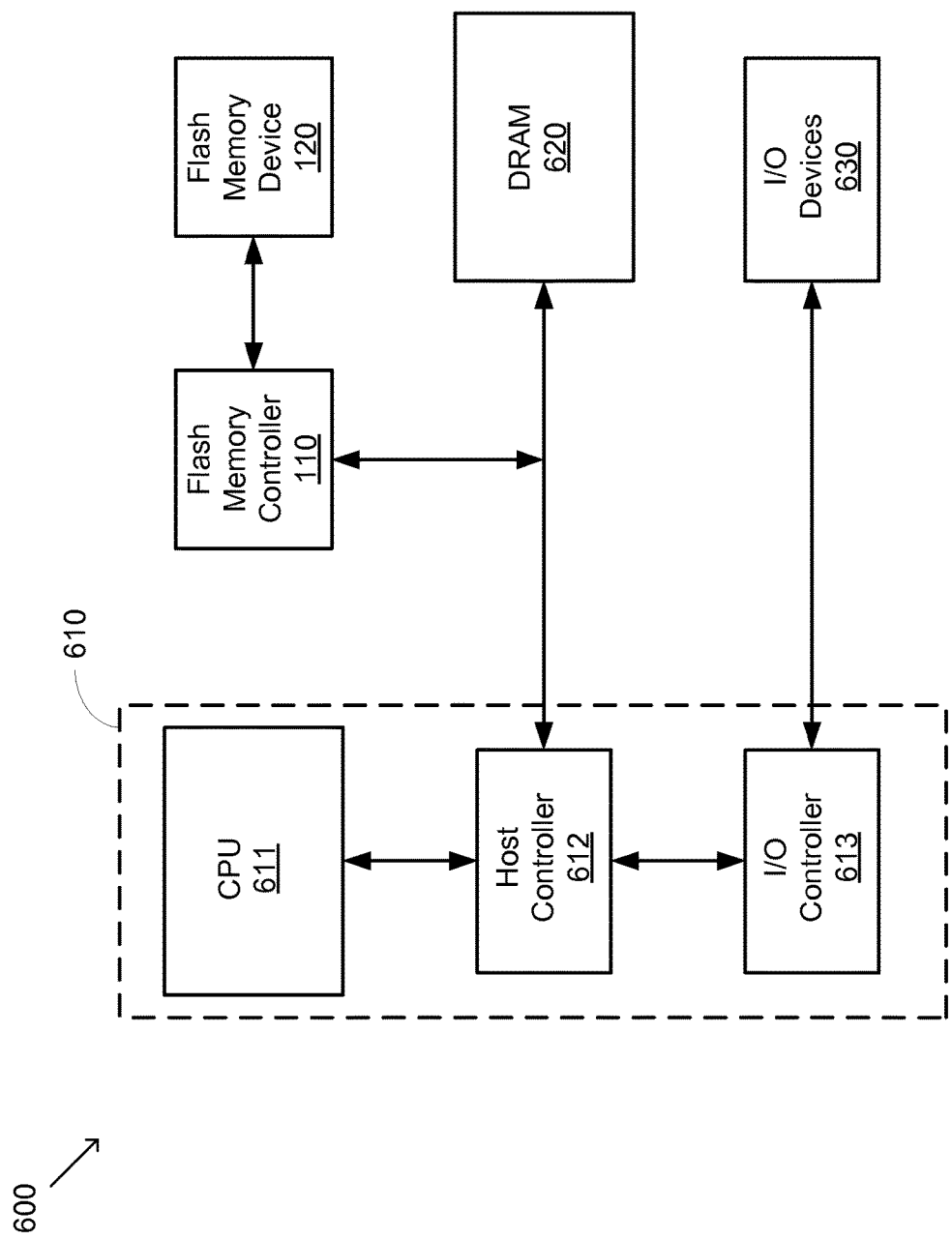
FIG. 6 shows a block diagram of a computer system within which present embodiments can be employed.

FIG. 6 shows an exemplary computer system 600 within which present embodiments can be employed. The system 600 includes a central processing unit (CPU) 611, a host controller 612, an I/O controller 613, a DRAM 620, I/O devices 630, the flash memory controller 110, and the flash memory device 120. The CPU 611 is connected to the host controller 612 and the I/O controller 613 via well-known buses. The CPU 611, the host controller 612, and the I/O controller 613 are well-known, and together form a host device 610 that is one embodiment of the host device 150 of FIGS. 1A-1C. For some embodiments, the CPU 611 and the host controller 612 can be formed on the same chip. For other embodiments, the CPU 611, the host controller 612, and the I/O controller 613 can be formed on the same chip.

The I/O controller 613 is coupled to the I/O devices 630, the latter potentially including well-known components such as, for example, a monitor, keyboard, mouse, and other I/O devices or circuits. The host controller 612 may be coupled to a DRAM system 620, which is employed as main memory for the computer system 600, as well as to the flash memory device 120 via the flash memory controller 110. For other embodiments, the flash memory controller 110 can be connected to the I/O controller 613 instead of the host controller 612. The flash memory device 120 can also function as main memory for the exemplary computer system shown in FIG. 6. For other embodiments, the DRAM 620 can be eliminated, and the flash memory device 120 can be employed as the primary main memory component.

Employing present embodiments of the flash memory controller 110 and the flash memory device 120 as main memory in the computer system 600 has several advantages over conventional flash memory systems. First, by programming the flash memory device 120 using a plurality of fractional program commands that are independently executable, the flash memory controller 110 can access the flash memory device 120 for other operations (e.g., read operations) during a programming operation. More specifically, because each fractional program command can be configured to apply a single program pulse to the addressed memory cells for a duration that is significantly shorter than the total duration of the programming pulse required to completely program the memory cells, the fractional program command requires significantly less time than a complete sequence of PV cycles. As a result, during a programming operation to addressed portions of the memory array, the flash memory controller 110 can quickly access other portions of the memory array by issuing an appropriate command (e.g., that accesses the other portions of the memory array) prior to issuing any more fractional program commands associated with the programming operation. Second, because the flash memory controller 110 schedules the application of individual program pulses to the memory cells during a programming operation, the flash memory controller 110 is aware of the progress of the programming operation, and therefore can also schedule the execution of other non-program commands in the memory device 120 in an efficient manner. This is in contrast to conventional flash memory systems in which the flash memory controller relinquishes control of programming operations to the flash memory device, during which time none of its memory cells are typically available for other operations.

In the above description, numerous specific details are set forth such as examples of specific, components, circuits, and processes to provide a thorough understanding of the present embodiments. It will be apparent, however, to one skilled in the art that these specific details need not be employed to practice the present embodiments. In other instances, well known components or methods have not been described in detail in order to avoid unnecessarily obscuring the present embodiments. Thus, although described above in the context of interleaving non-program operations with PV cycles of flash memory devices, the present embodiments are equally applicable to any type of memory device that utilizes incremental programming techniques.

What is claimed is:

1. A method of programming a memory device including memory cells, the method comprising:
   receiving at least one page program command, the page program command including a page address for addressing a page of the memory cells for a programming operation to program data in the addressed number of memory cells;
   executing the at least one page program command by generating fractional program commands, queuing the fractional program commands, and for each fractional program command, generating a corresponding program pulse separate from the fractional program command, and iteratively carrying out at least one program/verify cycle upon execution of each fractional program command to incrementally program each of the addressed page of memory cells by incrementally increasing a threshold voltage of each memory cell, wherein a subsequent program pulse is not generated until a corresponding fractional program command is received;
   selectively receiving a secondary command after initiating but before completing the programming operation, the selectively receiving occurring while pausing the programming operation, the secondary command inserted into the command queue between any of two adjacent selected fractional program commands;
   storing programmed states of the page of memory cells for a most recent program/verify cycle in storage other than the page of memory cells while carrying out an operation corresponding to the secondary command; and
   selectively resuming the programming operation by first retrieving the stored programmed states of the page of memory cells, verifying the page of memory cells, then carrying out at least one program/verify cycle on the page of memory cells.

2. The method of claim 1 wherein the page of memory cells are programmed simultaneously.

3. The method of claim 1 wherein:
   selectively resuming the programming operation comprises receiving a program resume command, and in response to the program resume command, first verifying the memory cells, then carrying out at least one program/verify cycle.

4. The method of claim 1 wherein the at least one page program command comprises a partial program command to partially program the page of memory cells.

5. The method of claim 1 wherein the selectively receiving a secondary command comprises:
   interrupting execution of the at least one program command with a non-program command.

6. The method of claim 1, wherein each fractional program command initiates execution of a program/verify cycle.

7. The method of claim 1 wherein the fractional program commands comprise respective program and verify commands, and wherein the verifying of the memory cells is initiated by a verify command.

8. The method of claim 1, wherein each fractional program command applies an incrementally increasing program voltage to the memory cells.

9. The method of claim 8, wherein the storage other than the page of memory cells comprises a state register, and retrieving the stored program states comprises reading the stored program information from the state register, and resuming programming starting with the stored program information.

10. The method of claim 1 wherein executing the at least one page program command begins by first carrying out a verify operation.

11. The method of claim 1 wherein the at least one page program command comprises one of a first program command that when executed begins with a verify operation, or a second program command that when executed begins with a programming operation.

12. A method of programming a page of nonvolatile memory cells, the method comprising:
   programming the number of memory cells by generating fractional program commands in response to a page program command, queuing the fractional program commands as independently executable commands in a command queue, for each fractional program command, generating a program pulse separate from the fractional program command, and applying a program voltage at an incremental level to the page of memory cells in response to each fractional program command, wherein a subsequent program pulse is not generated until a corresponding fractional program command is received;
   verifying the page of memory cells;
   iteratively repeating the applying and verifying on the page of memory cells by sequentially incrementally changing the program voltage toward a desired voltage level and verifying each incremental change in a threshold voltage of each memory cell;

pausing the programming by selectively receiving a secondary command after initiation but before completion of the programming on the page of memory cells to carry out a non-program operation, and inserting the secondary command between a selected two adjacent fractional program commands in the command queue; and storing programmed states of the page of memory cells while carrying out the non-program operation.

13. The method of claim 12 and further comprising:

resuming programming of the page of memory cells, after pausing the programming, by first retrieving the stored programmed states of the page of memory cells, verifying the page of memory cells, then carrying out at least one more programming and verifying sequence on the page of memory cells.

14. The method of claim 13 wherein resuming programming of the memory cells by first verifying comprises executing a verify command before a program command.

15. A non-volatile memory device comprising:

an array of non-volatile memory cells;

command interface logic to receive at least one page program command, the page program command including a page address for addressing a page of the non-volatile memory cells, the at least one page program command to initiate respective program and verify operations for programming each cell by generating fractional program commands, queuing the fractional program commands, for each fractional program command, generating a program pulse separate from the fractional program command, and incrementally increasing a program voltage for each cell and verifying a cell voltage against an incrementally increasing threshold voltage value for each cell in response to each fractional program command, each programming and verifying operation responsive to each fractional program command and defining a program/verify cycle, wherein a subsequent program pulse is not generated until a corresponding fractional program command is received;

a program state register to store program information for a most-recent program/verify cycle;

the command interface logic to selectively receive a secondary command after initiation but before completion of the programming;

inserting the secondary command between any two adjacent selected fractional program commands; and wherein before completion of the programming, the program state register stores the most-recent program information for the memory cells.

16. The non-volatile memory device of claim 15 wherein upon resuming programming, the program information for the memory cells is read from the program state register.

* * * * *